(12) United States Patent
Takekuma

(10) Patent No.: US 6,377,329 B1
(45) Date of Patent: Apr. 23, 2002

(54) SUBSTRATE PROCESSING APPARATUS

(75) Inventor: Takashi Takekuma, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/577,055

(22) Filed: May 22, 2000

(30) Foreign Application Priority Data

May 24, 1999 (JP) ............................................ 11-143424

(51) Int. Cl.[7] ..................... G03B 27/32; G03B 27/52; C23C 16/00
(52) U.S. Cl. ............................ 355/27; 355/30; 118/719
(58) Field of Search .............................. 355/27, 30, 53; 396/611, 612; 118/319, 320, 719; 414/940

(56) References Cited

U.S. PATENT DOCUMENTS 5,844,662 A * 12/1998 Akimoto et al. ............... 355/27
6,168,667 B1    1/2001 Yoshioka
6,270,576 B1 *  8/2001 Araki et al. ................... 118/52

* cited by examiner

Primary Examiner—Russell Adams
Assistant Examiner—Peter B. Kim
(74) Attorney, Agent, or Firm—Fulbright & Jaworski L.L.P.

(57) ABSTRACT

A substrate processing apparatus comprises a cassette section for loading/unloading plural cassettes, a first sub-arm mechanism provided in the cassette section, a first block having plural coating units, an interface section provided adjacent to a second block for exposing, a third block having plural developing units, a first main arm mechanism provided in the first block to allow the substrate to be passed to and from the first sub-arm mechanism and to be inserted into and taken out from the coating unit, a third main arm mechanism provided in the third block to allow the substrate to be passed to and from the first main arm mechanism and to be inserted into and taken out from the developing unit, a second sub-arm mechanism provided in the interface section to allow the substrate to be passed to and from the third main arm mechanism and to be passed to and from the second block, a forward bypath having one end extending toward the neighborhood of the cassette section and the other end extending toward the neighborhood of the interface section, and a forward direct feeding mechanism receiving the substrate from the first main arm mechanism and directly feeding the substrate from the first block to the interface section.

14 Claims, 13 Drawing Sheets

SUBSTRATE PROCESSING APPARATUS

CROSS-REFERENCE TO RELATED APPLICATIONS

This application is based upon and claims the benefit of priority from the prior Japanese Patent Application No. 11-143424, filed May 24, 1999, the entire contents of which are incorporated herein by reference.

BACKGROUND OF THE INVENTION

The present invention relates to a substrate processing apparatus for coating a resist solution onto a substrate, such as a semiconductor wafer and liquid crystal display substrate, and developing a resist coated film.

In the case where a semiconductor device is manufactured by utilizing a photolithography, use is made of a system with a substrate processing apparatus (coating/developing apparatus) and light exposure apparatus combined.

As shown in FIG. 1, a conventional substrate processing apparatus includes a cassette section 10, a coating block S1, developing block S2 and interface section 51 and is connected to a light exposure apparatus S3 through the interface section 51. Such substrate processing apparatus is operated as will be set out below.

A sub-arm conveying mechanism not shown takes out a wafer W from a cassette C and conveys it to a first passing base 11. A first main arm conveying mechanism MA1 takes out the wafer W from a first passing base 11 and conveys it to the coating unit 12, heat treating section 15 and second passing base 13. Then a second main arm conveying mechanism MA2 takes out the wafer W from the second passing base 13 and conveys it to a third passing base 14. Then, the sub-arm conveying mechanism, not shown, takes out the wafer W from a third passing base 14, conveys it to an interface section 51 and passes it to a transfer arm mechanism, not shown, of the light exposure apparatus S3. And the wafer W is transferred to a light exposure stage and a resist coated film is patterned with a light exposure.

The wafer W is conveyed, in a backward path reverse to that set out above, from the light exposure apparatus S3 to the third passing base 14. The second main arm conveying mechanism MA2 takes out the wafer W from the third passing base 14 and conveys it to a heat treating section 17, developing unit 16 and second passing base 13. Then the first main arm conveying mechanism MA1 takes out the wafer W from the second passing base 13 and conveys it to the first passing base 11. The sub-arm conveying mechanism takes out the wafer W from the first passing base 11 and stores it in the cassette C.

In recent times, an anti-reflective film has been used to coat it on the upper or lower side of the resist film and its dedicated-use coating unit has been adopted within the coating block S1. For this reason, more number of steps are required in the coating block S1 and an increasing burden is borne on the first main arm conveying mechanism MA1. In the conventional system, however, the first main arm conveying mechanism MA1 not only conveys the wafer W in the coating block S1 but also bears a burden to allow the wafer W to be passed between the cassette section 10 and the developing block S2, so that an excess burden is borne on the mechanism. For this reason, the wafer W stays longer in the developing block S2 side in a stand-by state and the throughput is lowered.

In the developing block S2, each processing has to be done in a predetermined shorter time and each unit in the developing block S2 contends with other units for the second main arm conveying mechanism MA2. In addition thereto, the second main conveying mechanism MA2 has also a burden to allow the wafer W to be passed between the interface section 51 and the coating block S1, so that it bears an excessive burden. For this reason, the wafer W stays longer in the interface section 51 in a stand-by state and the throughput is lowered.

BRIEF SUMMARY OF THE INVENTION

It is accordingly the object of the present invention to provide a substrate processing apparatus which can alleviate a burden on a main arm conveying mechanism and ensures a higher throughput.

(1) There is provided a substrate processing apparatus according to the present invention which processes substrates one by one in accordance with a photolithography, comprising a cassette section for loading/unloading a plurality of cassettes; a first sub-arm conveying mechanism provided in the cassette section to insert and take out the substrate into and from the cassette; a first processing block provided adjacent to the cassette section and having a plurality of coating units for coating a resist solution onto the substrate; and interface section provided adjacent to a second processing block for exposing, with light, a resist-coated film formed on the substrate by the coating unit; a third processing block provided between the interface section and the first processing block and, having a plurality of developing units for developing the resist coated film exposed by the second processing block with light; a first main arm conveying mechanism provided in the first processing block to allow the substrate to be passed to and from the first sub-arm conveying mechanism and to allow the substrate to be inserted into and taken out from the coating unit; a third main arm conveying mechanism provided in the third processing block to allow the substrate to be passed to and from the first main arm conveying mechanism and to allow the substrate to be inserted into and taken out from the developing unit; a second sub-arm conveying mechanism provided in the interface section to allow the substrate to be passed to and from the third main arm conveying mechanism and to allow the substrate to be passed to and from the second processing block; a forward bypath so provided as to extend from the first processing block to the third processing block and having one end extending toward the neighborhood of the cassette section and the other end extending toward the neighborhood of the interface section; and a forward direct feeding mechanism movable along the forward bypath and so provided as to prevent an interference with the third main arm conveying mechanism, the forward direct feeding mechanism receiving the substrate coated with the resist by the coating unit from the first main arm conveying mechanism and directly feeding the substrate from the first processing block to the interface section.

According to the above-mentioned invention, the resist-coated substrate is fed by the forward direct feeding mechanism from the first processing block straight toward the interface section, thus alleviating a burden on the third main arm conveying mechanism in the third processing block (developing block).

(2) There is provided a substrate processing apparatus according to the present invention which processes substrates one by one in accordance with a photolithography, comprising a cassette section for loading and unloading a plurality of cassettes; a first sub-arm conveying mechanism provided in the cassette section to insert and take out the substrate into and from the cassette; a first processing block provided adjacent to the cassette section and having a plurality of coating units for coating a resist solution onto the substrate; an interface section provided adjacent to a second processing block for exposing, with light, the resist coated film formed on the substrate by the coating unit; a third processing block provided between the interface section and the first processing block, and having a plurality of developing units for developing the resist coated film exposed with light by the second processing block; a first main arm conveying mechanism provided in the first processing block to allow the substrate to be passed to and from the first sub-arm conveying mechanism and to allow the substrate to be inserted into and taken out from the coating unit; a third main arm conveying mechanism provided in the third processing block to allow the substrate to be passed to and from the first main arm conveying mechanism and to allow the substrate to be inserted into and taken out from the developing unit; a second sub-arm conveying mechanism provided in the interface section to allow the substrate to be passed to and from the third main arm conveying mechanism and to allow the substrate to be passed to and from the second processing block; a backward bypath so provided as to extend from the first processing block to the third processing block and having one end extending toward the neighborhood of the cassette section and the other end extending toward the neighborhood of the interface section; and a backward direct feeding mechanism movable along the backward bypath and so provided as to prevent an interference with the first main arm conveying mechanism, the backward direct feeding mechanism receiving the substrate developed by the developing unit from the third main arm conveying mechanism and directly feeding the substrate from the third processing block to the cassette section.

According to the above-mentioned invention, the developed substrate is fed by the backward direct feeding mechanism from the third processing block straight to the cassette section and, therefore, this alleviates a burden on the first main arm conveying mechanism in the first processing block (resist coating block).

(3) There is provided a substrate processing apparatus according to the present invention which processes substrates one by one in accordance with a photolithography, comprising a cassette section for loading/unloading a plurality of cassettes; a first sub-arm conveying mechanism provided in the cassette section and having a plurality of coating units for coating a resist solution onto the substrate; an interface section provided adjacent to a second processing block for exposing, with light, a resist coated film formed on the substrate by the coating unit; a third processing block provided between the interface section and the first processing block, and having a plurality of developing units for developing the resist coated film exposed with light by the second processing block; a first main arm conveying mechanism provided in the first processing block to allow the substrate to be passed to and from the first sub-arm conveying mechanism and to insert and take out the substrate into and from the coating unit; a third main arm conveying mechanism provided in the third processing block to allow the substrate to be passed to and from the first main arm conveying mechanism and to allow the substrate to be inserted into and taken out from the developing unit; a second sub-arm conveying mechanism provided in the interface section to allow the substrate to be passed to and from the third main arm conveying mechanism and to allow the substrate to be also passed to and from the second processing block; a forward bypath so provided as to extend from the first processing block to the third processing block and having one end extending toward the neighborhood of the cassette section and the other end extending toward the neighborhood of the interface section; a forward direct feeding mechanism movable along the forward bypath and so provided as to prevent an interference with the third main arm conveying mechanism, the forward direct feeding mechanism receiving the substrate coated with the resist by the coating unit from the first main arm conveying mechanism and directly feeding the substrate from the first processing block to the interface section; a backward bypath so provided as to extend from the first processing block to the third processing block and having one end extending toward the neighborhood of the cassette section and the other end extending toward the neighborhood of the interface section, and a backward direct feeding mechanism movable along the backward bypath and so provided as to prevent an interference with the first main arm conveying mechanism, the backward direct feeding mechanism receiving the substrate developed by the developing unit from the third main arm conveying mechanism and directly feeding the substrate from the third processing block to the cassette section.

The above-mentioned apparatus has both the forward direct feeding mechanism and the backward direct feeding mechanism and, therefore, alleviates a burden on the first and third main arm conveying mechanisms and improves the throughput.

Further, the feeding of the substrate to the interface section may be effected by selectively using the forward direct feeding mechanism or the third main arm conveying mechanism. Further, the feeding of the substrate to the cassette section may be effected by selectively using the backward direct feeding mechanism or the first main arm conveying mechanism. These increase the degree of freedom with which the processing is done.

The present apparatus may further includes a first heating section provided in the first processing block and heat-baking the resist coating film formed on the substrate and a first sub-conveying mechanism provided in the first processing block to allow the substrate which is heat-baked by the first heating section to be passed to the forward direct feeding mechanism.

Still further, the present apparatus may include a third heating section provided in the third processing block and heat-baking the substrate having a resist coated film exposed with light and a third sub-conveying mechanism provided in the third processing block and passing the substrate which is heat-baked by the third heating section to the backward direct feeding mechanism.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
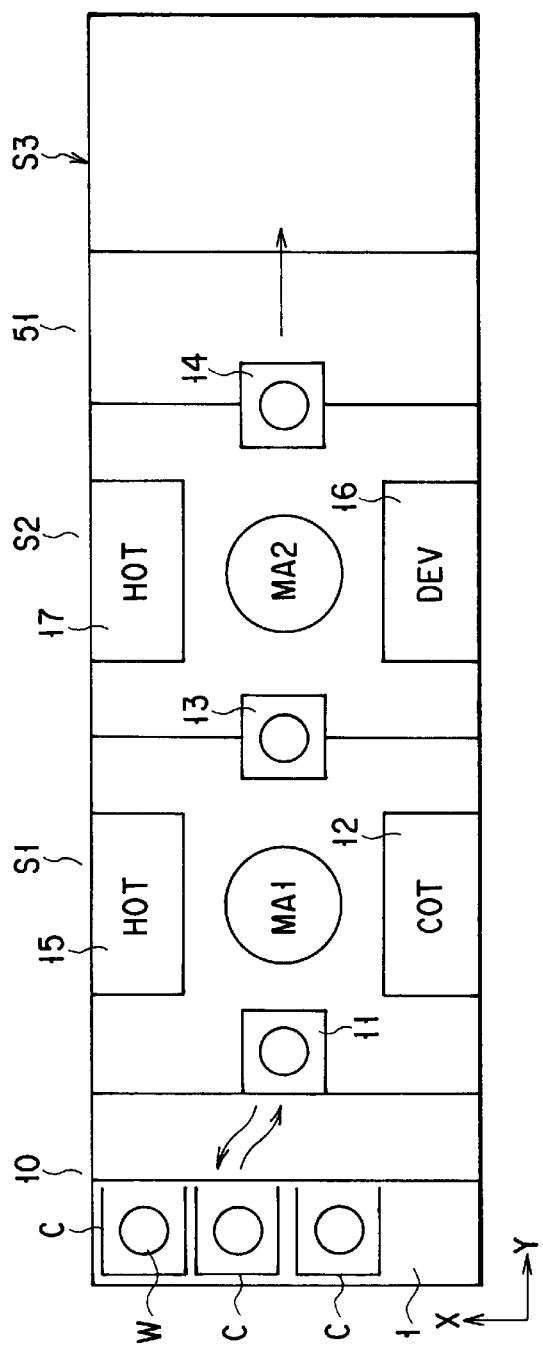
FIG. 1 is a plan view diagrammatically showing a conventional apparatus.

Various preferred embodiments of the present invention will be explained below with reference to the accompanying drawing.

As shown in FIGS. 1 to 5, a substrate processing apparatus (coating/developing apparatus) includes a cassette section 10, coating block (first processing block) 100, developing block (third processing block) 300, interface block 51, and controller 90. A light exposure apparatus 52 corresponding to a second processing block 200 is connected to a substrate processing apparatus through the interface section 51.

Figure 2:
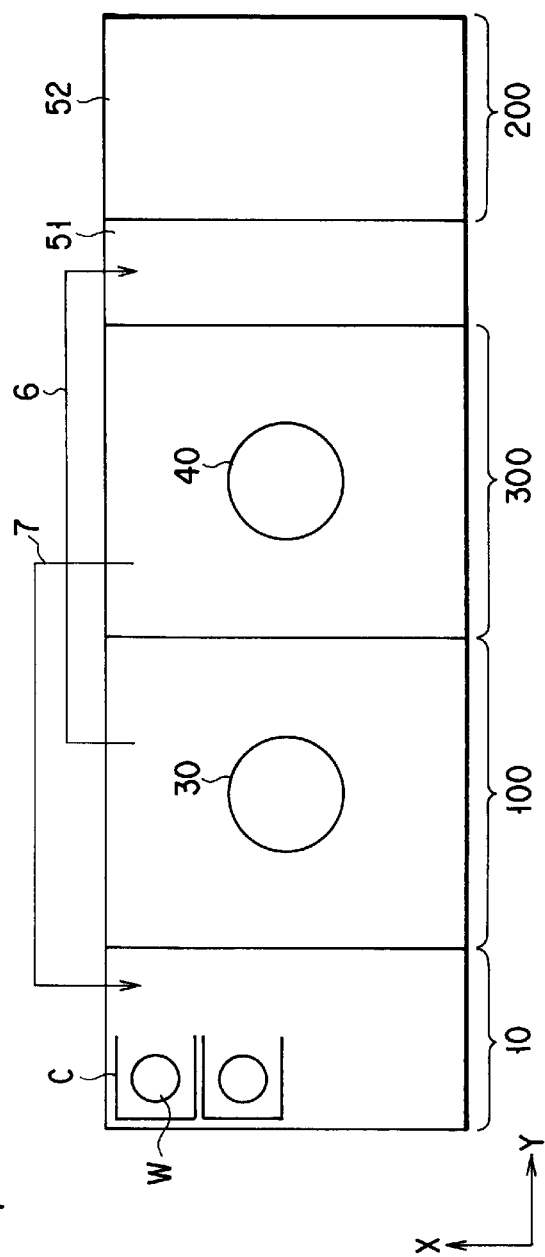
FIG. 2 is a plan view diagrammatically showing a substrate processing apparatus according to an embodiment of the present invention.
Figure 3:
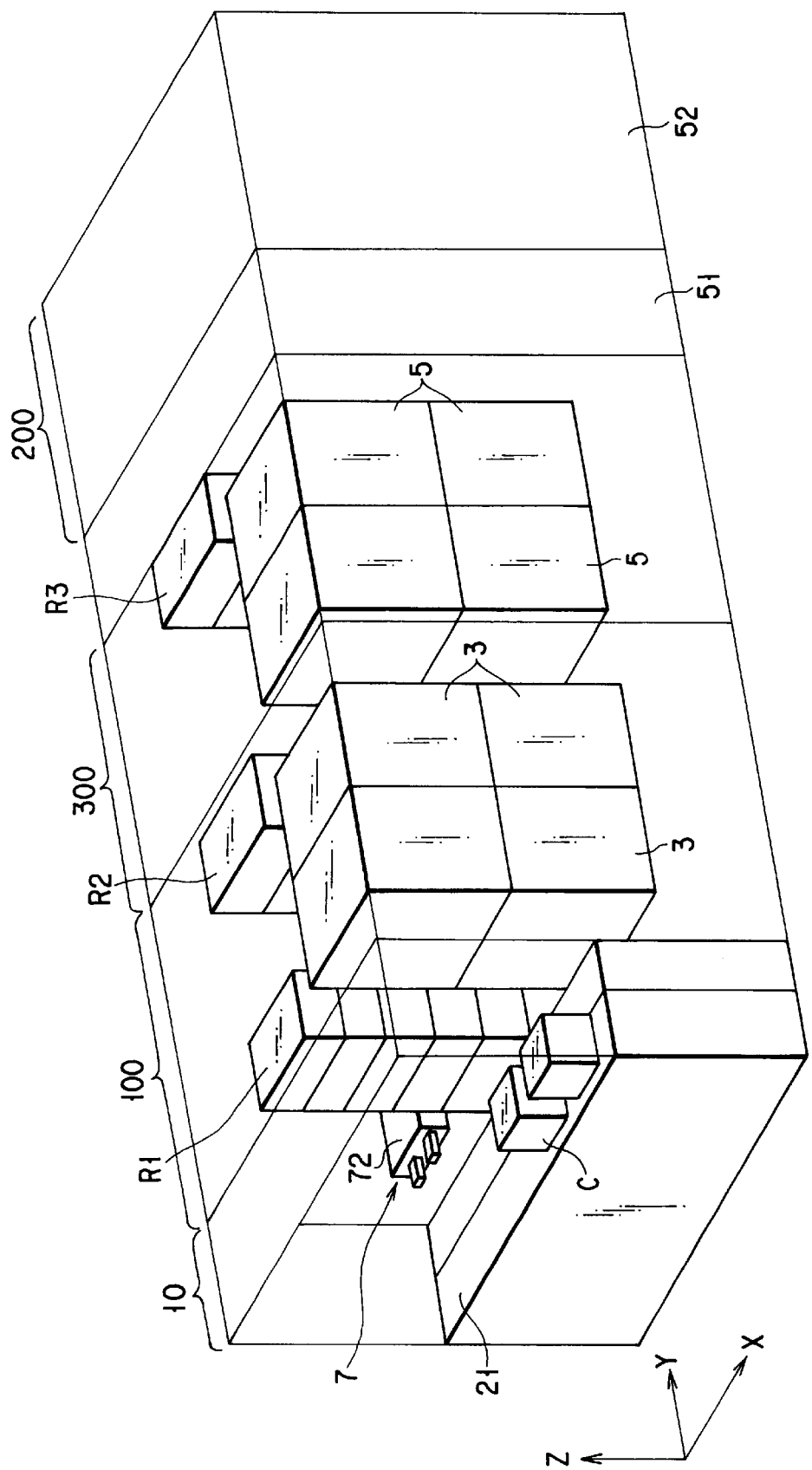
FIG. 3 is a perspective see-through view diagrammatically showing the substrate processing apparatus according to the embodiment of the present invention as viewed from a front surface side.
Figure 5:
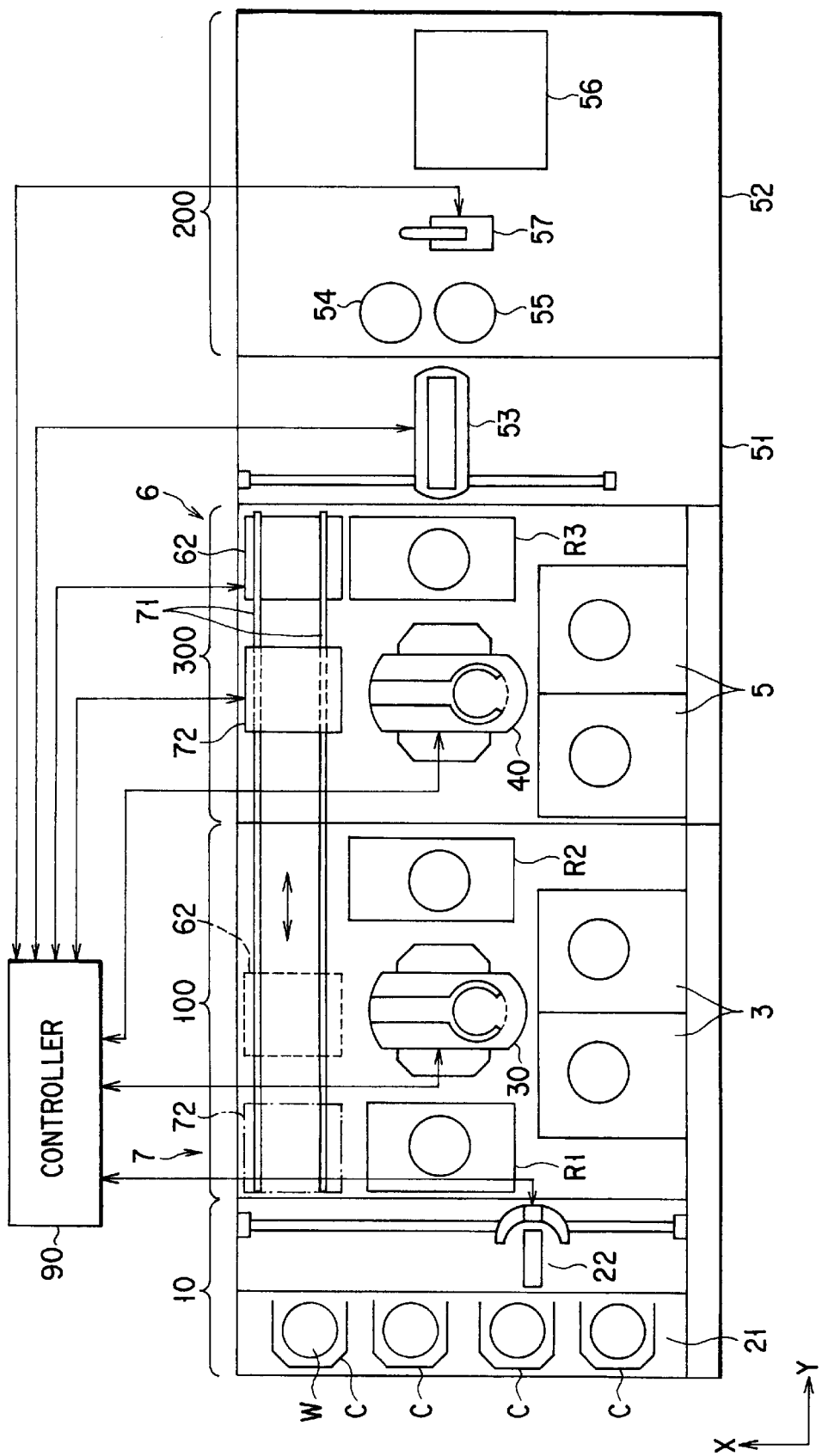
FIG. 5 is an inner see-through plan view diagrammatically showing a substrate processing apparatus of the embodiment.

As shown in FIGS. 2 and 5, the cassette section 10, first processing block 100, third processing block 300, interface section 51 and second processing block 200 are arranged in that order along a Y axis direction. These sections and blocks are detachably connected.

The cassette section 10 includes a stage 21 and first sub-arm conveying mechanism 22. The stage 21 extends in the X-axis direction. Cassettes C can be placed by a four-arm unit on the stage 22 and are loaded and unloaded onto and from the stage 21 by a conveying robot or operator, not shown. The cassette C stores, for example, 25 semiconductor wafer W per lot.

The first sub-arm conveying mechanism 22 includes an arm holder for holding the wafer W, advance/withdraw drive mechanism for advancing or withdrawing the arm holder, Y axis drive mechanism for moving the arm holder in the X-direction, a liftable drive mechanism for moving the arm holder in a z-axis direction, and θ rotation drive mechanism for rotating the arm holder around the Z-axis. The first sub-arm conveying mechanism 22 is adapted to load and unload the wafer W onto and from the cassette C and pass the wafer W to and from a first main arm conveying mechanism 30 as will be set out below.

The first processing block 100 includes four coating units 3, two shelf units R1, R2 and first main arm conveying mechanism 30. The four coating units 3 are arranged on a front surface side of the apparatus and are laid out in two-stage/two-array way and, out of these, the upper stage side units 3 are used for resist coating and lower stage units 3 are used for an anti-reflective coating film. The first shelf unit R1 is arranged on the side of the cassette section 10 and the second shelf unit R2 is on the side of the third processing block 300. The first main arm conveying mechanism 30 is arranged at the center of the first processing block 100.

Figure 6:
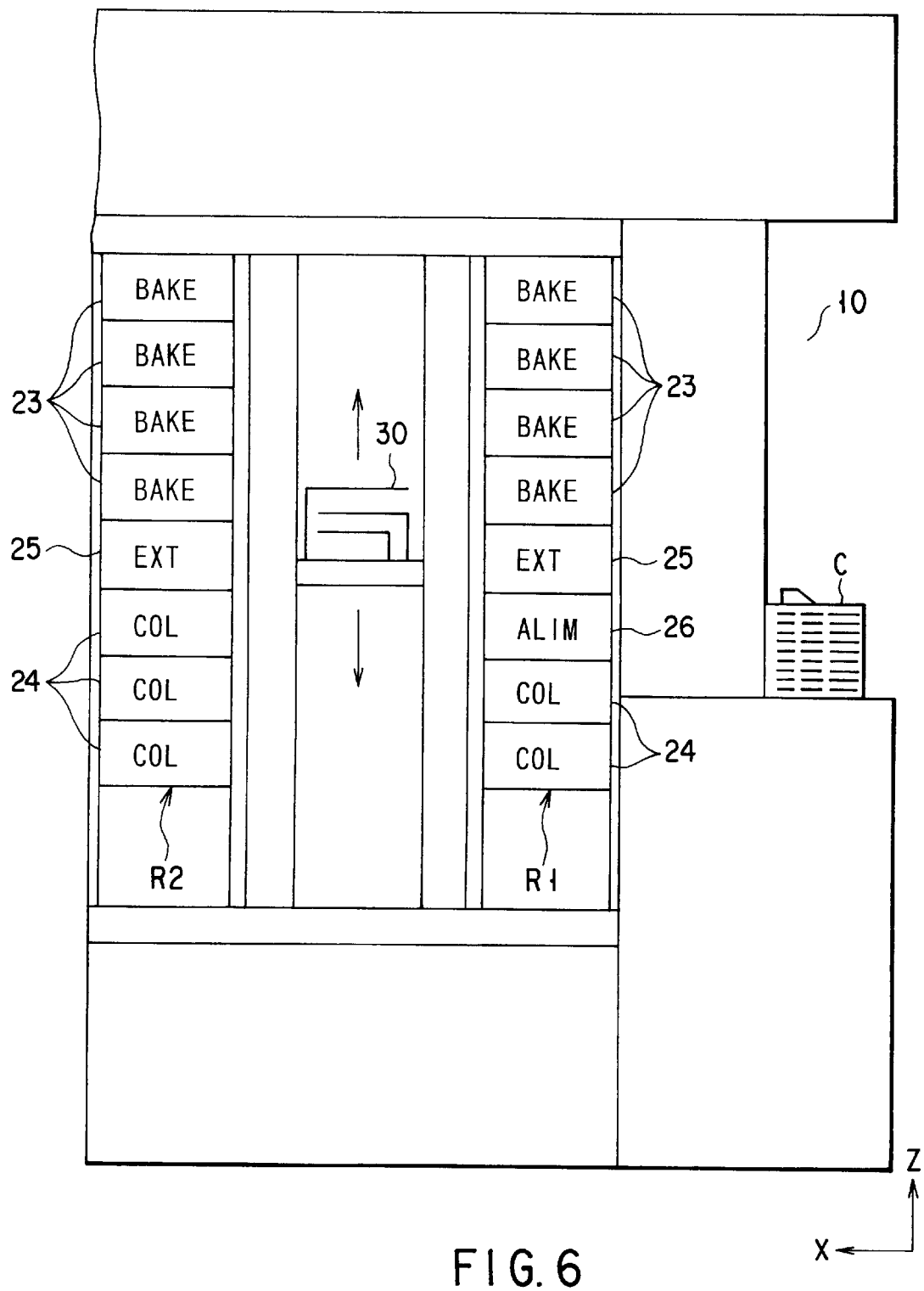
FIG. 6 is an inner see-through side view diagrammatically showing the substrate processing apparatus of the embodiment.

As shown in FIG. 6, two cooling units 24, positioning unit 26, passing unit 25 and four heating units 23 are stacked up on the first shelf unit R1 in a bottom-up direction. The wafer W is passed, by the passing unit 25 of the shelf unit R1, between the sub-arm conveying mechanism 22 and the main arm conveying mechanism 30. Three cooling units 24, passing unit 25 and four heating units 23 are stacked up on the second shelf unit R2 in a bottom-up direction. The wafer W is passed, by the passing unit 25 of the shelf unit R2, between the first main arm conveying mechanism 30 and a second main arm conveying mechanism 40. A power supply circuit for these cooling units 24 and heating units 23 is connected to an output section of a controller 90 and amounts of power supply to the cooling plates and heating plates are controlled by the controller.

The third processing block 300 includes four developing unit 5, third shelf unit R3, and third main arm conveying mechanism 40. The four developing unit 5 is arranged on the front surface side of the apparatus. The developing unit 5 is laid out in a two-stage/two-array way. The third shelf unit R3 is arranged on the side of the interface section 51 and the third main arm conveying mechanism 40 is arranged at the center of the third processing unit 300.

Figure 7:
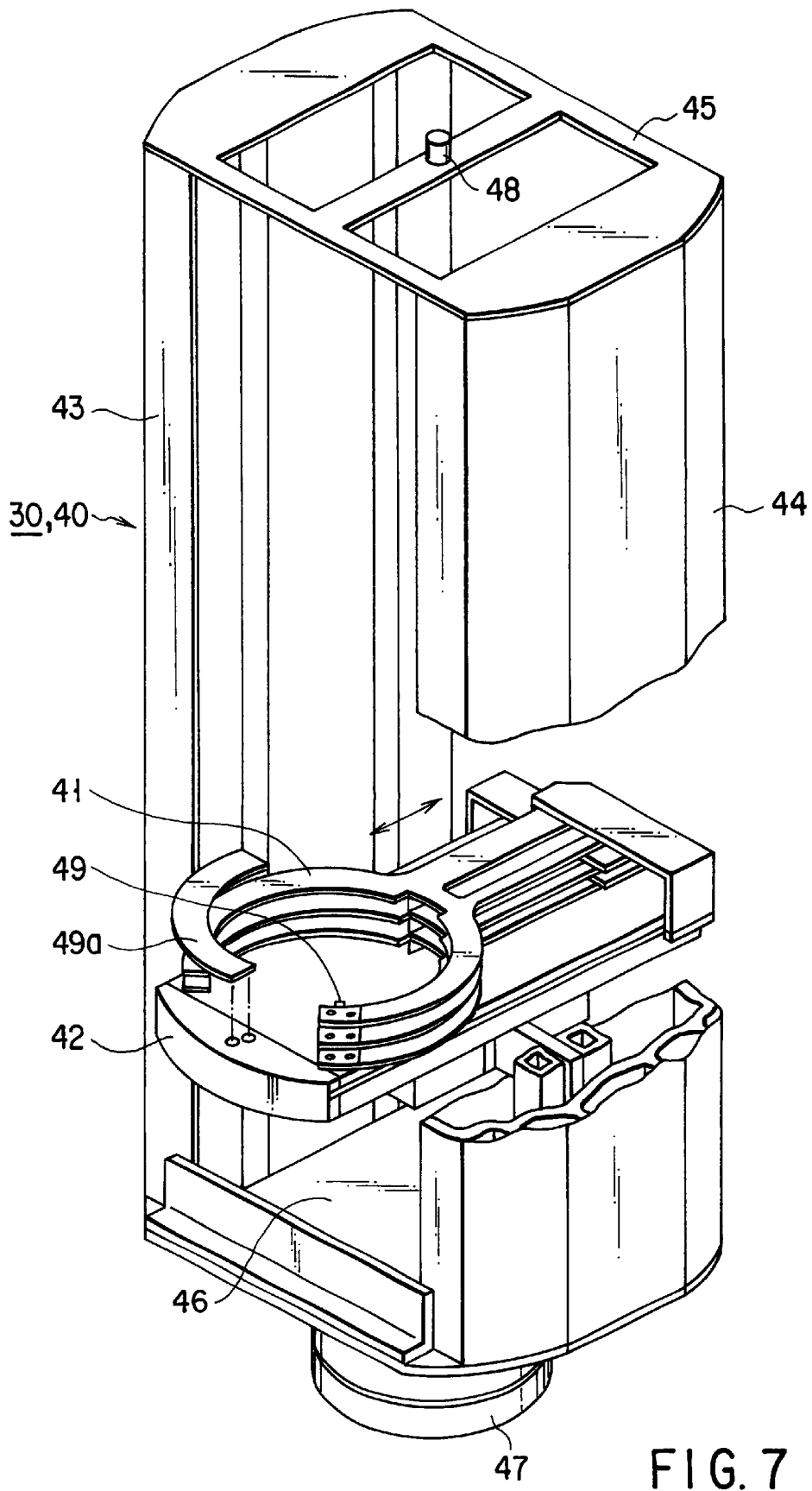
FIG. 7 is a perspective view showing a major section of a main arm conveying mechanism in a partly cut state.

As shown in FIG. 7, the main arm conveying mechanisms 30 and 40 include an arm holder 41, base 42, pair of guide rails 43, 44, coupling members 45, 46, motor 47 and rotation shaft 48. The arm holder 41 is so supported by the base 42 as to be movable back and forth. The base 42 is liftable up and down along the pair of guide rails 43, 44. The upper and lower end sections of the guide rails 43, 44 are coupled by the coupling members 45, 46 to provide a frame body. The frame body is so supported by the rotation shaft 48 as to be rotatable around the z-axis direction. When the frame body is rotated by the motor 47 around the rotation shaft 48, then the direction of the arm holder 41 is varied thereby.

The arm holder 41 is of such a three-stage type as to hold the wafer W in place and is adapted to support the wafer W by three claws 49 provided at the respective stages. The arm holder 41 is so supported as to be slidably movable along the length of the base 42. The back/forth action of the arm holder 41 is controlled by a drive means not shown. The up/down lifting operation of the base 42 is controlled by another drive means not shown. A light sensor is supported on the base 42 through a member 49a. The light sensor detects the presence or absence of the wafer W on the arm holder 41.

Figure 8:
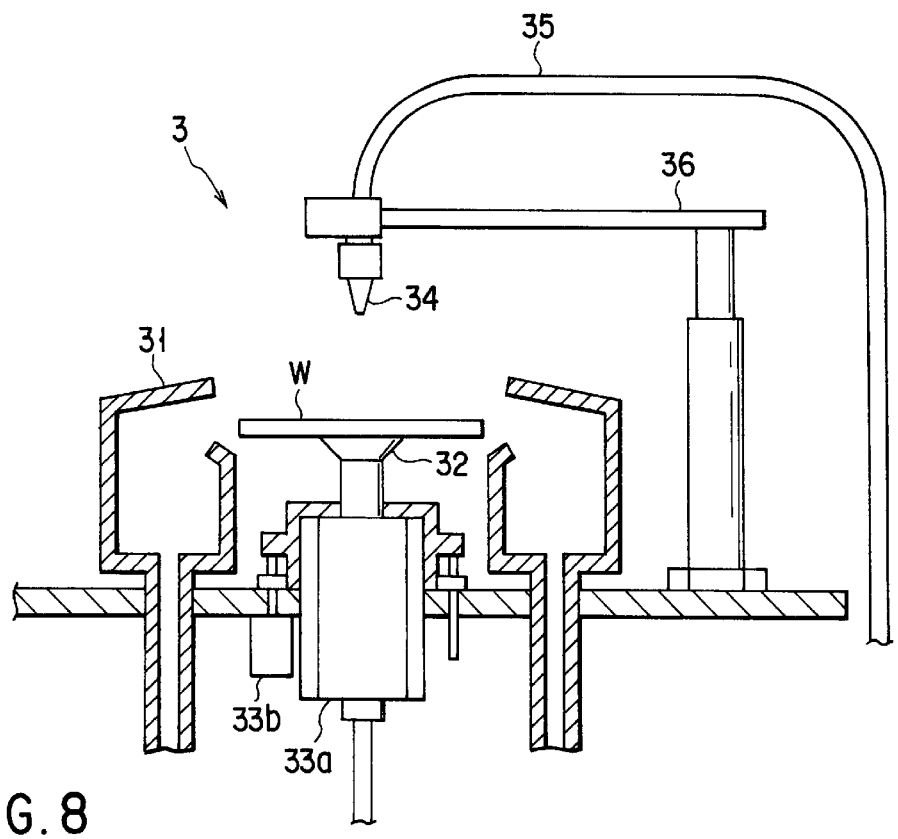
FIG. 8 is a cross-sectional view diagrammatically showing a coating unit.

As shown in FIG. 8, the coating unit 3 includes a cup 31, spin chuck 32 and nozzle 34. The spin chuck 32 is so supported by a rotation drive mechanism 33a and 33b as to be rotatable and liftable up and down. The spin chuck 32 has a vacuum suction function to suck and hold the wafer W in place on its upper surface. The nozzle 34 is connected to a resist solution supply source or anti-reflective coating solution supply source, not shown, and movably supported on a horizontal arm.

The developing unit 5 is so configured as to have substantially the same structure as that of the above-mentioned coating unit 3. However, a developing solution supply nozzle, not shown, is different from the resist solution supply nozzle 34 and has a solution discharge section equal in length to substantially a diameter of the wafer W.

The interface section 51 is arranged adjacent to the developing block 300. Further, a light exposure apparatus 52 is arranged, as a second processing block 200, adjacent to the interface section 51. The light exposure apparatus 52 includes a convey-in stage 54, convey-out stage 55, light exposure section 56 and conveying arm mechanism 57. The conveying arm mechanism 57 has its operation controlled by the controller 90 and conveys the wafer W between both the stages 54, 55 and a light exposure section 56.

Figure 4:
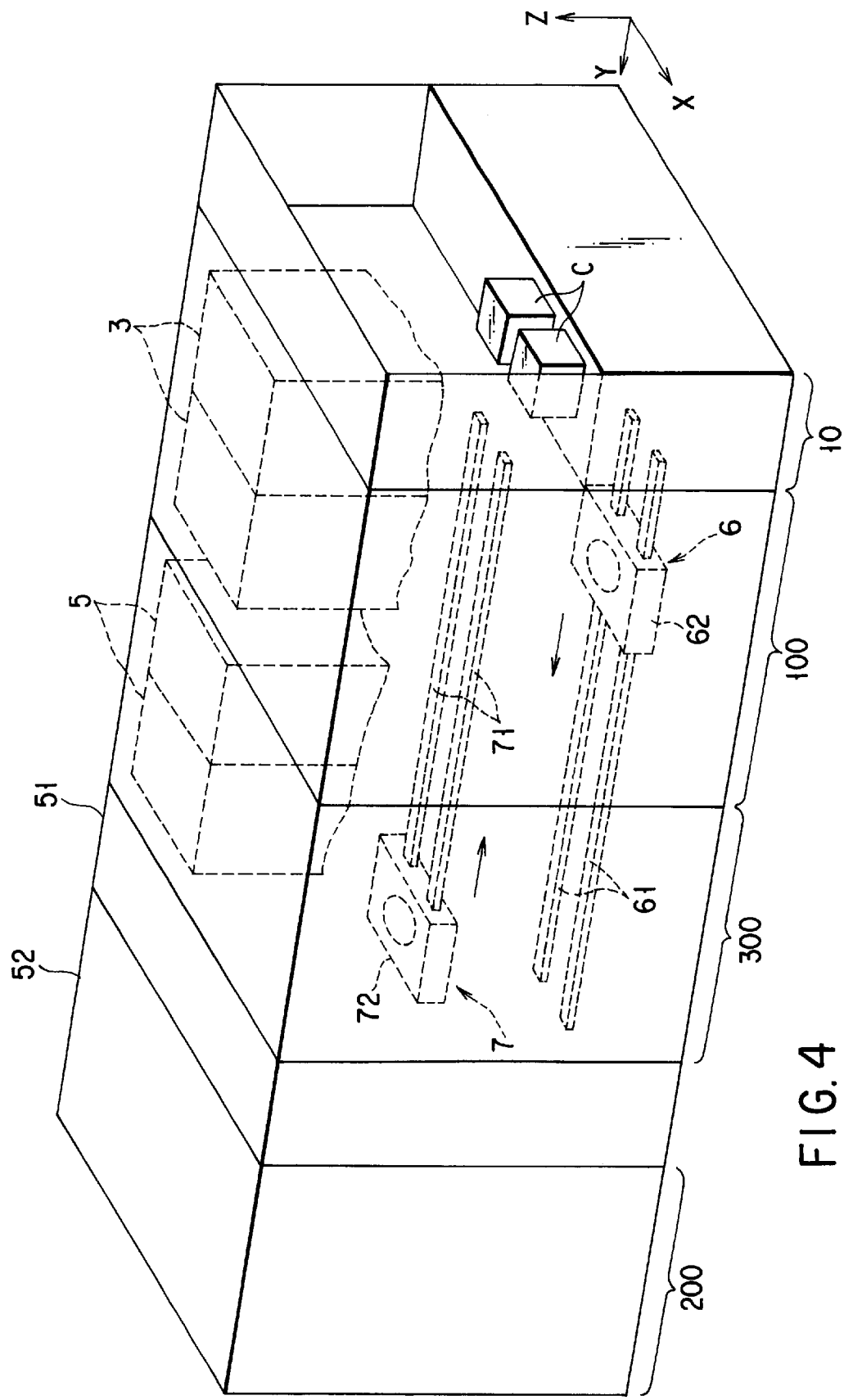
FIG. 4 is a perspective see-through view diagrammatically showing the substrate processing apparatus according to the embodiment of the present invention as viewed from a back surface side.

As shown in FIGS. 4 and 5, a forward direct feeding mechanism 6 extends from the first processing block 100 to a second processing block 300 and has a rail (forward bypath) 61 extending in the Y-axis direction and a direct feeding unit 62. One end of the forward bypath 61 reaches a boundary between the interface section 51 and the third processing block 300 to allow the wafer W which is straight fed by the direct feeding unit 62 to be passed to the second sub-arm conveying mechanism 53.

A backward direct mechanism 7 is so provided as to extend from the first processing block 100 to the second processing block 300 and has a rail (backward bypath) 71 extending in the Y-axis direction and a direct feeding unit 72. One end of the backward bypath 71 reaches a boundary between the cassette section 10 and the first processing block 100 to allow the wafer W which is straight fed by the direct feeding unit 72 to be passed to the first sub-arm conveying mechanism 22.

Figure 9:
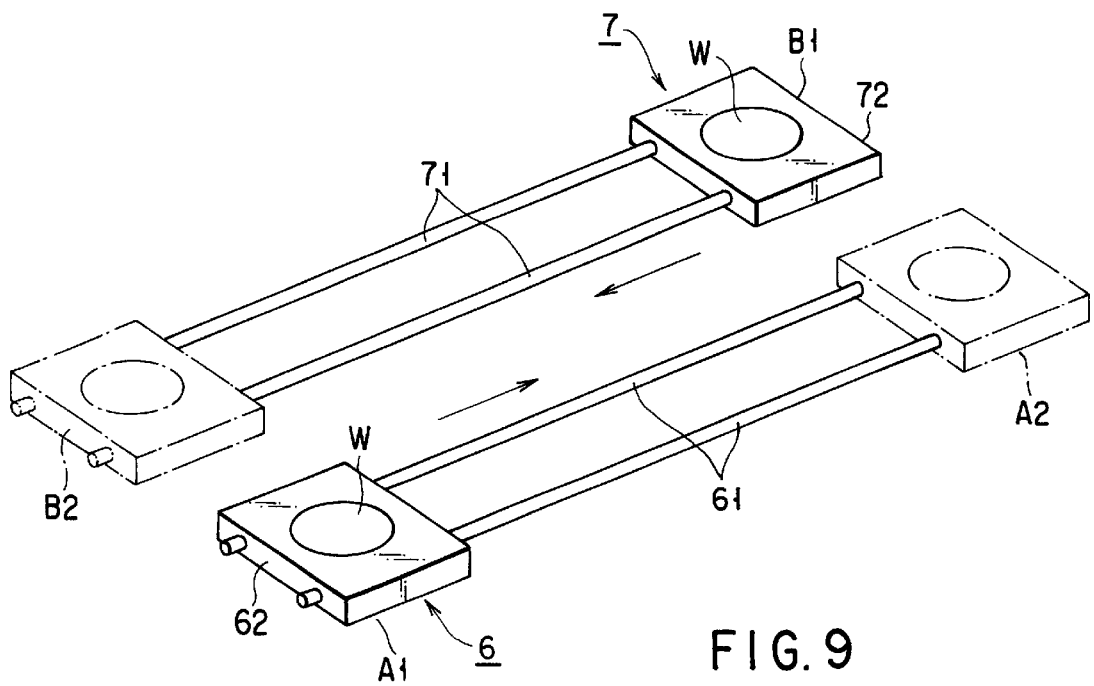
FIG. 9 is a perspective view showing a forward path transfer mechanism and backward path transfer mechanism of the embodiment.

Both the mechanisms 6 and 7 are so arranged as to prevent an interference with the substrate conveying areas of the fist and third man arm feeding mechanisms 30 and 40. That is, the bypaths 61, 71 of the mechanisms 6, 7 pass on the back surface side of the first and third main arm feeding mechanisms 30 and 40. That is, the bypaths 61, 71 of the mechanisms 6, 7 pass on the back surface of the first and third processing blocks 100, 300 and, as shown in FIG. 9, the forward direct feeding unit 62 is movable from a position A1 to a position A2 and a backward direct feeding unit 72 is movable from a position B1 to a position B2. The forward direct feeding unit 62 allows the wafer W to be passed to the second sub-arm conveying mechanism 53 at the position A2. On the other hand, the backward direct feeding unit 72 allows the wafer W to be passed to the first sub-arm conveying mechanism 22 at the position B2.

Figure 15:
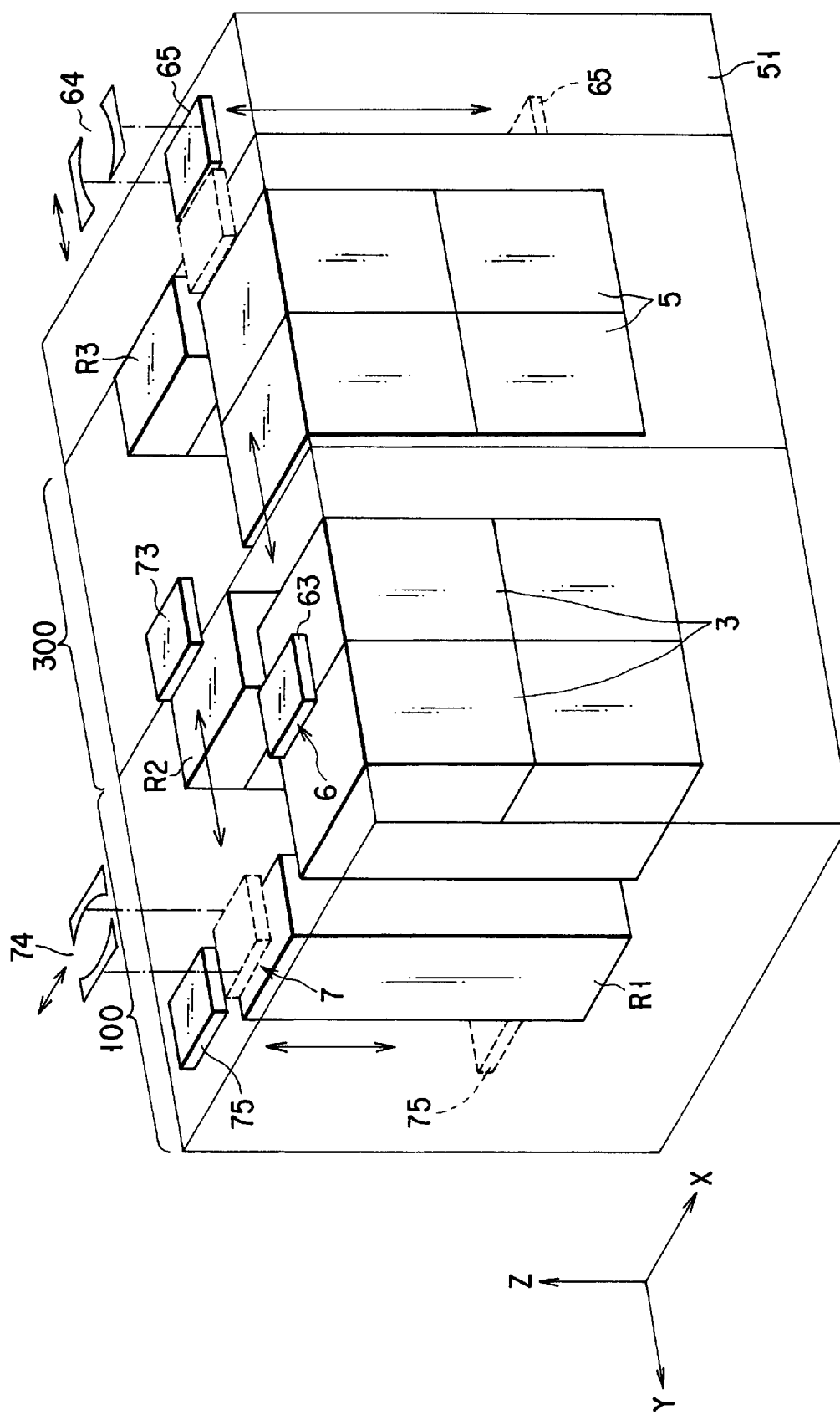
FIG. 15 is an inner perspective see-through view diagrammatically showing a substrate processing apparatus according to another embodiment.
Figure 16:
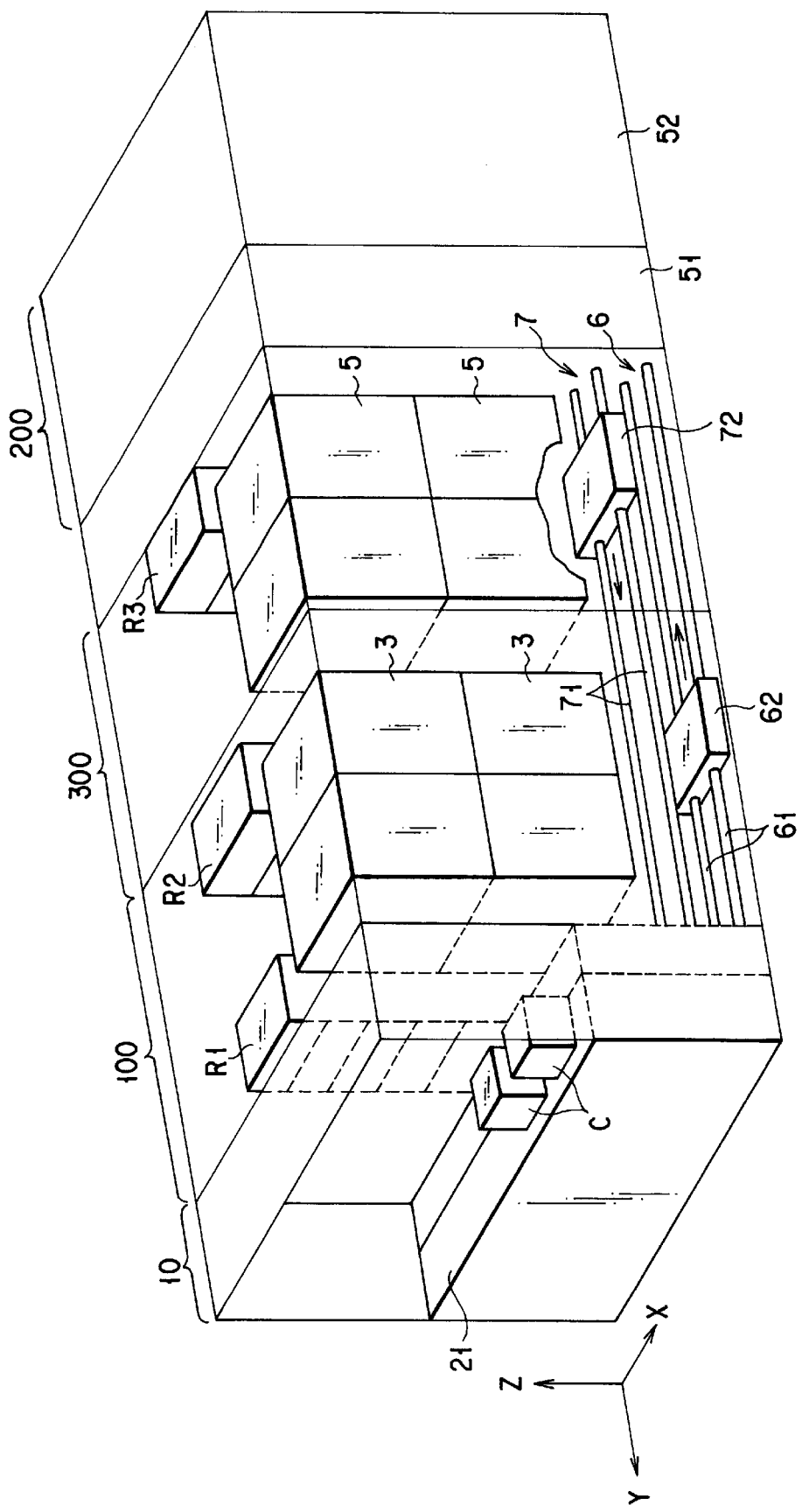
FIG. 16 is an inner perspective see-through view diagrammatically showing a substrate processing apparatus according to another embodiment.
Figure 17:
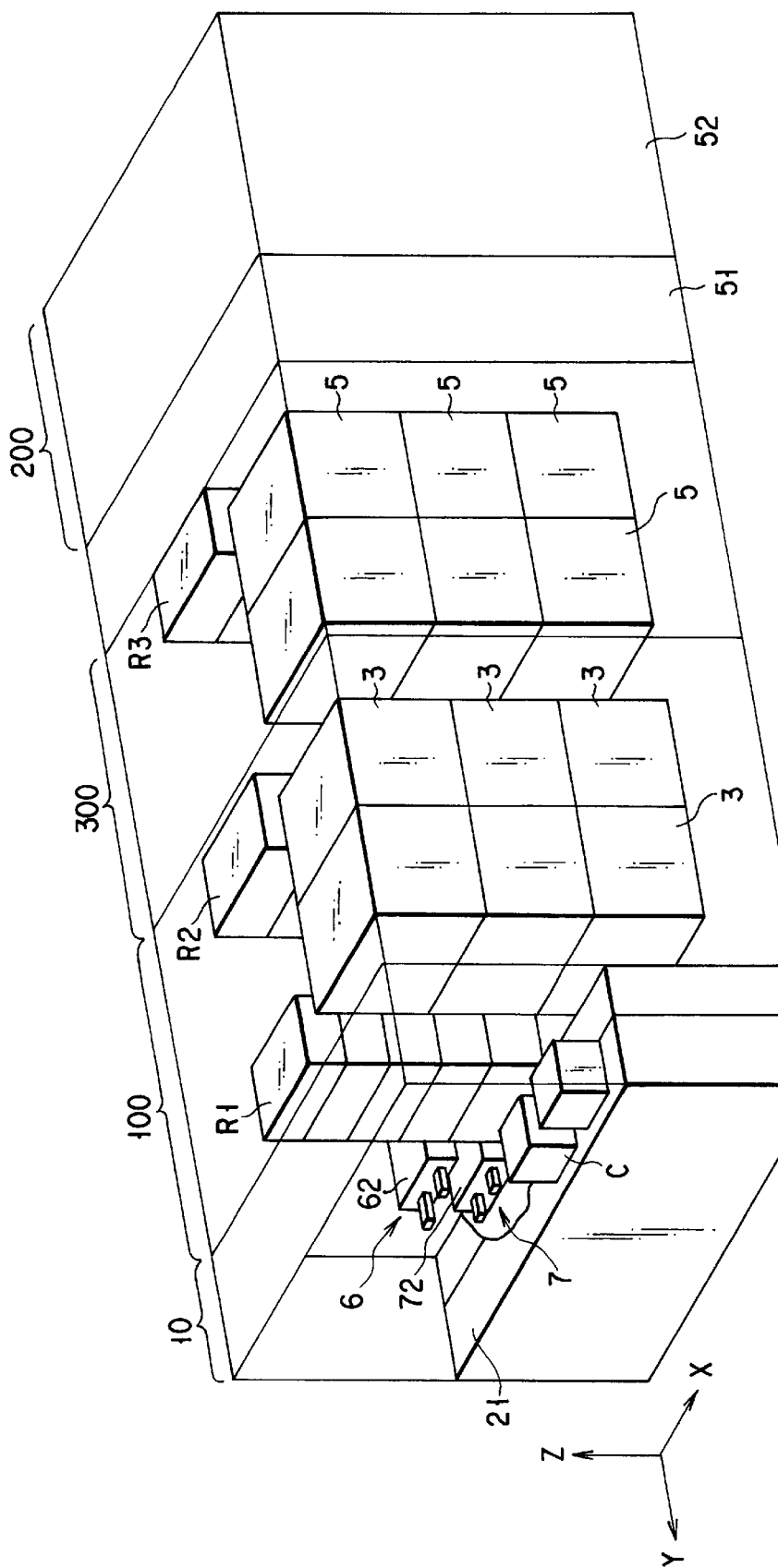
FIG. 17 is an inner perspective see-through view diagrammatically showing a substrate processing apparatus of another embodiment.

In the present embodiment, as shown in FIG. 4, the mechanisms 6, 7 are arranged on the back surface side of the substrate processing apparatus. As shown in FIGS. 9 and 4, the forward direct feeding mechanism 6 is arranged beneath the backward direct feeding mechanism 7. It is to be noted that the forward direct feeding mechanism 6 and backward direct feeding mechanism 7 may be arranged in such a position as set out above and, as shown in FIG. 15, arranged above the first and third processing blocks 100, 300. Further, as shown in FIG. 16, these mechanisms 6, 7 may be arranged below the first and third processing blocks 100, 300. Further, as shown in FIG. 17, the forward direct feeding mechanism 6 may be provided on the upper side and the backward direct feeding mechanism 7 on the lower side. Further, according to the present embodiment, although the coating unit 3 and developing unit 5 are stacked in a two-stage way, the coating unit 3 and developing unit 5 may be stacked in a three-stage way as shown in FIG. 17.

The operation of the apparatus of the present embodiment will be explained below.

First, the automatic conveying robot (or operator) sets a cassette C on the stage 21. Then the first sub-arm conveying mechanism 22 takes out a wafer W from the cassette C and places it on the passing section 26. The first main arm conveying mechanism 30 takes out the wafer W from the passing section 26 and conveys it to the coating unit 3 where a solution for an anti-reflective film is coated on the wafer W. Then, the first main arm conveying mechanism 30 conveys the wafer W to another coating unit 3 and coats a resist solution on the wafer. Then the first main arm conveying mechanism 30 conveys the wafer W to the heating section 23 where the resist film is baked in a predetermined temperature range. Then, the first main arm conveying mechanism 30 conveys the wafer W to a cooling section 24 where it is cooled to about room temperature.

Then, the first main arm conveying mechanism 30 passes the wafer W to the direct feeding unit 62 of the forward direct feeding mechanism 6 at the position A1. The unit 62 is moved along the forward bypath 61 from the position A1 to the position A2 and passes the wafer W to the second sub-arm conveying mechanism 53 of the interface section 51. The second sub-arm conveying mechanism 53 conveys the wafer W to the stage 54 of the light exposure block 200 and places it there. The conveying arm mechanism 57 conveys the wafer W to the light exposure section 56 where the resist film is patterned with a light exposure. After the light exposure, the conveying arm mechanism 57 conveys the wafer W to the stage 55 and places it there.

The second sub-arm conveying mechanism 53 takes out the wafer W from the stage 55 and places it in the passing section 25 of the third processing block 300. The third main arm conveying mechanism 40 takes out the wafer W from the passing section 25 and conveys it to a heating unit 23 where the resist film is baked (PEB) to a predetermined temperature. Then the third main arm conveying mechanism 40 conveys the wafer W from the heating unit 23 to the cooling unit 24 where it is cooled to room temperature.

Then the third main arm conveying mechanism 40 takes out the wafer W from the cooling unit 24 and conveys it to a developing unit 5. After a developing process, the third main arm conveying mechanism 40 takes out the wafer W from the developing unit 5 and conveys it to the position B1 and passes it to the direct feeding unit 72. The unit 72 is moved along the backward bypath 71 from the position B1 to the position B2 where the wafer W is passed to the first sub-arm feeding mechanism 22 of the cassette section 10.

The first sub-arm conveying mechanism stores the wafer W in the cassette C.

According to the above-mentioned embodiment, the wafer W can be conveyed by the forward direct feeding mechanism 6 to the light exposure block 200 without using the third main arm conveying mechanism 40.

It is to be noted that, by selecting any of the feeding mechanism 6 and third main arm conveying mechanism 40, the resist-coated wafer may be passed to the sub-arm conveying mechanism 53 of the interface section 51. Further, the developed wafer W may be passed to the sub-arm conveying mechanism 22 of the cassette section 10 by selecting any of the feeding mechanism 7 and first main arm conveying mechanism 30.

Figure 10:
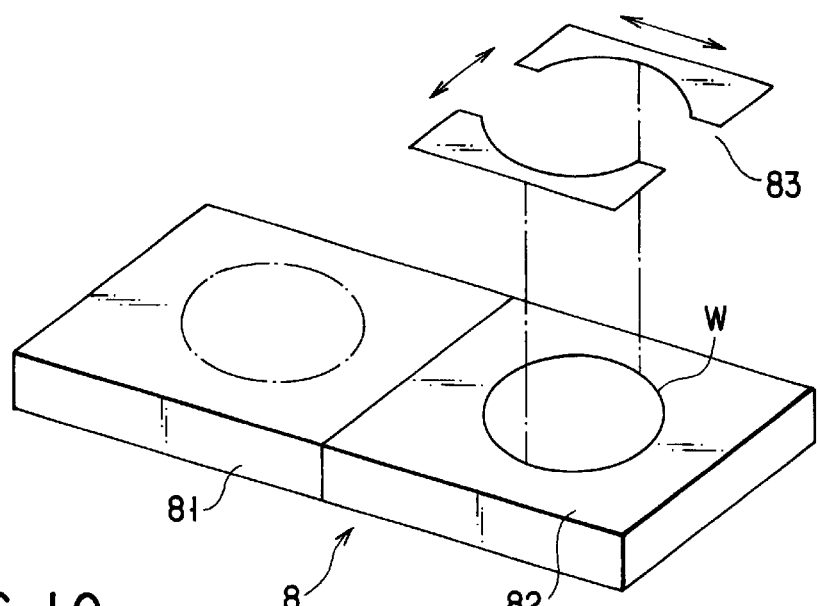
FIG. 10 is a perspective view schematically showing a heating/cooling mechanism of a CHP unit.

Now, another embodiment will be explained below with reference to FIG. 10.

In this embodiment, a heating/cooling section 8 is provided at shelf units R1, R2 in a coating block 100 and a dedicated-use sub-conveying mechanism 83 is attached to the heating/cooling section 8. The mechanism 83 has a pair of chucks for grasping a wafer W, drive means for opening and closing the pair of chucks and drive means for moving the chucks in the horizontal direction.

In this apparatus, a resist-coated wafer W is passed from the first main arm conveying mechanism 30 to a heating plate 81 and then the wafer W is grasped by the sub-conveying mechanism 83 and transferred onto a cooling plate 82. And using the sub-conveying mechanism 83 a conveyance is made from the cooling plate 82 to a forward direct feeding mechanism 6. It is to be noted that the sub-conveying mechanism 83 corresponds to the first sub-conveying mechanism.

Incidentally, a heating/cooling section may also be provided at a shelf unit R3 of a developing block 300 and a second sub-conveying mechanism 83 is attached to the heating/cooling section and, using the second sub-conveying mechanism 83, the wafer W may be passed to a backward direct feeding mechanism 7.

Figure 11:
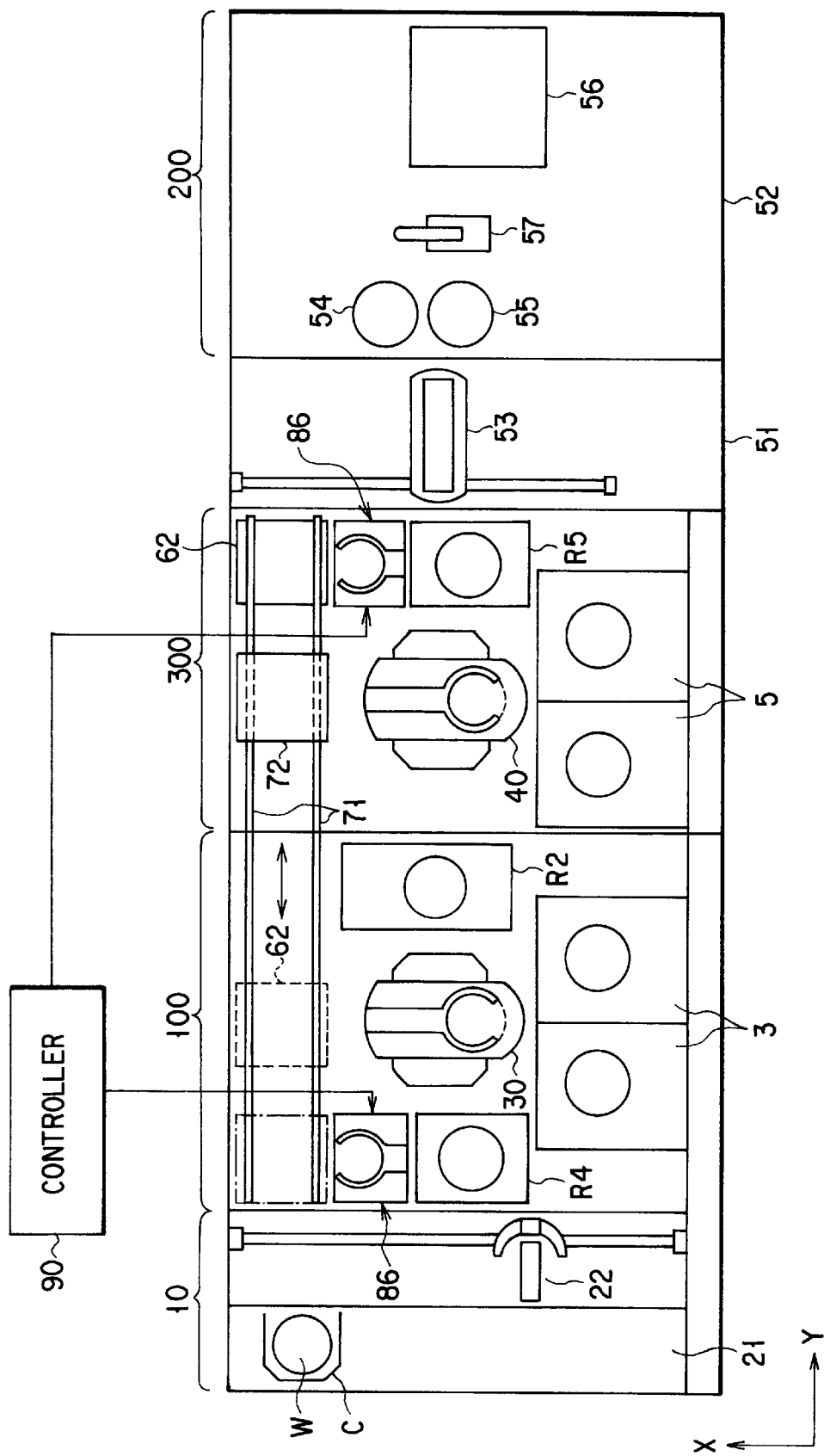
FIG. 11 is an inner see-through plan view showing a substrate processing apparatus according to another embodiment.

A still another embodiment will be explained below by referring to FIGS. 11 to 13.

Figure 12:
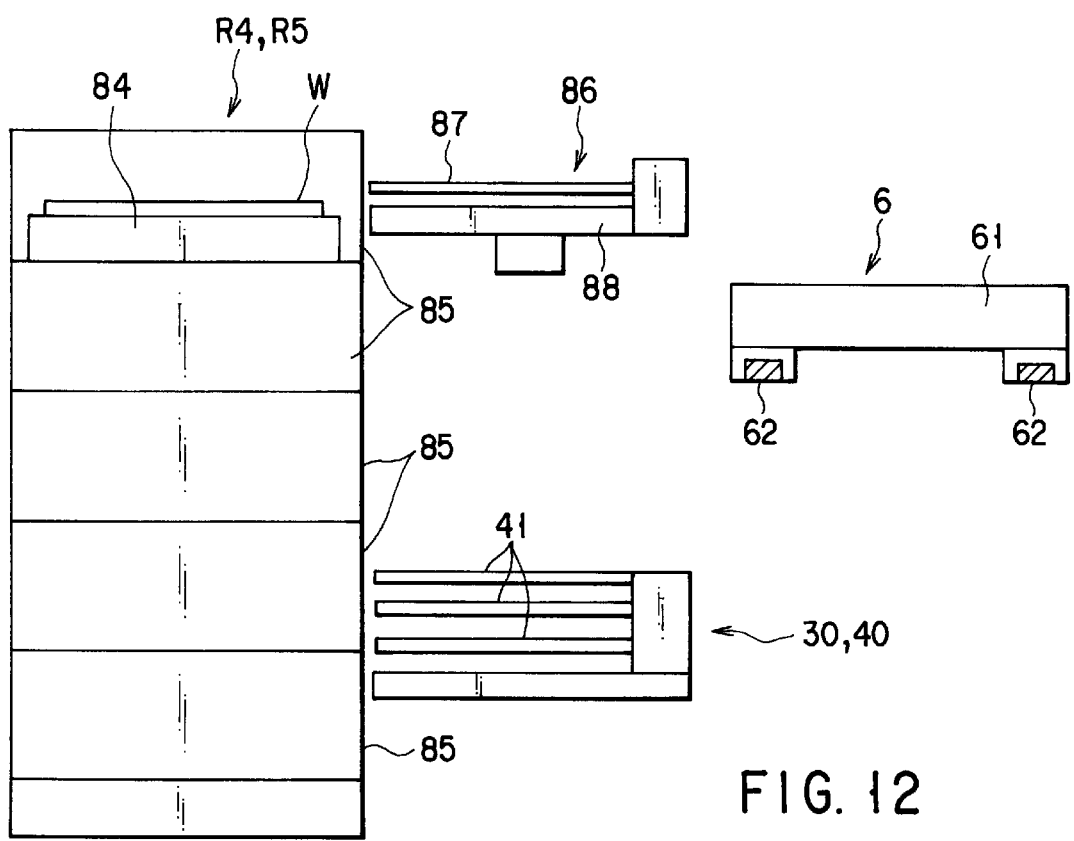
FIG. 12 is a side view showing a portion of the apparatus of the embodiment above.

In a coating block 100, use is made of, in place of the shelf units R1, R2, shelf units R4, R5 having a plurality of heating sections 85 as shown in FIG. 12. Further, as shown in FIG. 11, a dedicated-use sub-conveying mechanism 86 is arranged near the shelf unit R4 to allow a wafer W to be passed between a forward direct feeding mechanism 6 and the shelf unit R4 and another dedicated-use sub-conveying mechanism 86 is arranged near the shelf unit R5 to allow the wafer W to be passed between a backward direct feeding mechanism R5.

Figure 13:
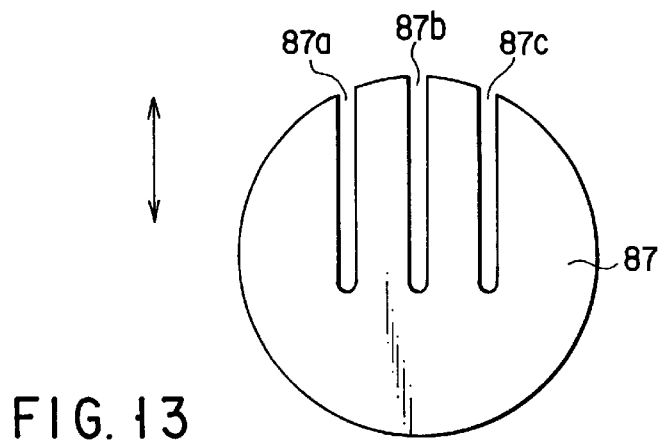
FIG. 13 is a plan view showing an arm holder of a first sub-arm transfer mechanism.

As shown in FIG. 13, the sub-conveying mechanism 86 has an arm holder 87 having slits 87a, 87b and 87c cut from a forward edge toward a rear side. The arm holder 87 is supported on a base 88 and moved/guided along a guide (not shown) of the base 88. That is, the arm holder 87 is moved back and forth in an XY plane by a back/forth moving drive mechanism, not shown, is up/down lifted by a Z-axis drive mechanism, not shown, and is rotated around a Z-axis by a θ rotation mechanism, not shown.

The slits 87a, 87b and 87c, upon receiving the wafer W from a heating plate 84, are projected from the surface of the heating plate 84 and prevent an interference with a lifting pin, not shown, for lifting the wafer W.

In the present embodiment, a heated wafer W is cooled on the arm holder 87, cooled by the direct feeding unit 61 of the forward direct feeding mechanism 6 and further cooled to room temperature by a cooling plate provided at an interface section 200. It is to be noted that the structure of FIG. 12 may be adopted by a developing block 300.

Still further, shelf units, not shown, for performing pre-processing and post-processing may be provided on a left side (the forward direct feeding mechanism 6 side) in the coating block 100 as seen from the cassette section 10 to allow the direct feeding unit 72 mechanism 7 to pass through the interior of the shelf unit. Even in the developing block 300, similar shelf units, not shown, may be provided to allow the direct feeding unit 62 of the mechanism 6 to be passed through the interior of the shelf unit. Incidentally, the forward direct feeding mechanism 6 and backward direct feeding mechanism 7 may be shared.

Figure 14:
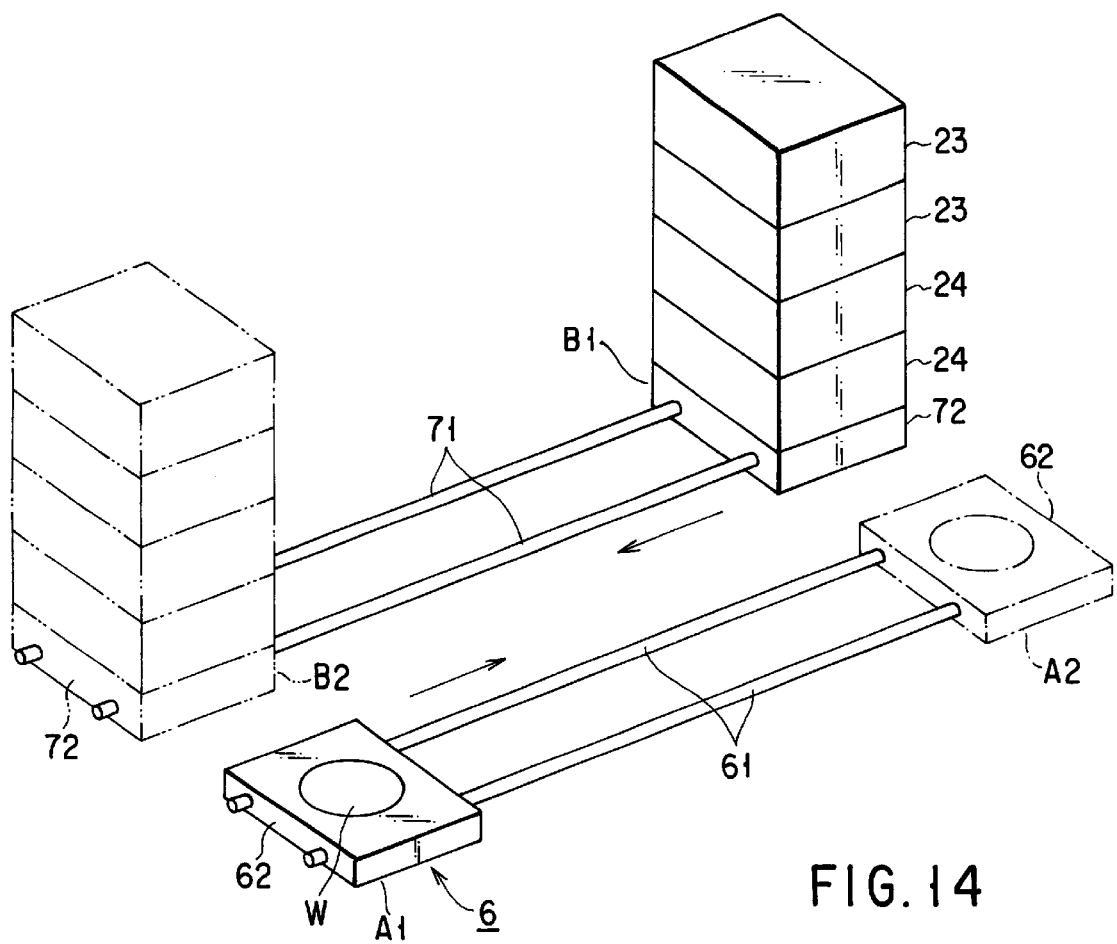
FIG. 14 is a perspective view showing a forward direct feeding mechanism and backward direct feeding mechanism of the embodiment above.

As shown in FIG. 14, the backward direct feeding mechanism 7 may further have a plurality of heating units 23 and of cooling units 24. By doing so, the conveying time of the wafer W is shortened, thus improving the throughput.

As shown in FIG. 15, it may be possible that the forward direct feeding mechanism 6 is arranged above the coating unit 3 and developing unit 5, opening/closing chucks 64 are placed on an interface section 51 and lifting base 65 is placed beneath opening/closing chucks 64. Further, it may be possible that the backward direct feeding mechanism 7 is arranged above shelf units R2, R3 and an opening/closing chuck 74 is arranged above the cassette section 51 and the lifting base 75 is arranged beneath the opening/closing chuck 74.

In such apparatus, a resist-coated wafer W is passed from the first main arm conveying mechanism 30 to the straight feeding unit 63, conveyed, transferred from the straight feeding unit 63 onto the opening/closing chuck 64, transferred from the opening/closing chuck 64 onto the lifting base 65, lowered and transferred from the lifting base 65 onto the second sub-arm conveying mechanism 53 of the interface section 51. On the other hand, a developed wafer W is passed from the third main arm conveying mechanism 40 to the straight feeding unit 73, conveyed, transferred from the straight feeding unit 73 onto the opening/closing chucks 74, transferred from the opening/closing chucks 74 onto the lifting base 75, lowered and transferred from the lifting base 75 onto the first sub-arm conveying mechanism 22 of the cassette section 51.

As shown in FIG. 16, the forward direct feeding mechanism 6 and backward direct feeding mechanism 7 may be arranged below the first and third processing blocks 100 and 300.

As shown in FIG. 17, the forward direct feeding mechanism 6 may be provided on an upper side and the backward direct feeding mechanism 7 may be provided on the lower side.

Further, as shown in FIG. 17, the coating unit 3 and developing unit 5 may be stacked, respectively, in a three-stage way.

Although, in the above-mentioned embodiment, the semiconductor wafer has been explained as being processed, the present invention is not restricted thereto and it is also applied to a substrate for a liquid crystal display.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing apparatus for processing substrates one by one in accordance with a photolithography, comprising:

a cassette section for loading/unloading a plurality of cassettes;

a first sub-arm conveying mechanism provided in the cassette section to insert and take out the substrate into and from the cassette;

a first processing block provided adjacent to the cassette section and having a plurality of coating units for coating a resist solution onto the substrate;

an interface section provided adjacent to a second processing block for exposing, with light, a resist coated film formed on the substrate by the coating unit;

a third processing block provided between the interface section and the first processing block, and having a plurality of units for developing the resist coated film exposed with light by the second processing block;

a first main arm conveying mechanism provided in the first processing block to allow the substrate to be passed to and from the first sub-arm conveying mechanism and to allow the substrate to be inserted into and taken out from the coating unit;

a third main arm conveying mechanism provided in the third processing block to allow the substrate to be passed to and from the first main arm conveying mechanism and to allow the substrate to be inserted into and taken out from the developing unit;

a second sub-arm conveying mechanism provided in the interface section to allow the substrate to be passed to and from the third main arm conveying mechanism and to allow the substrate to be also passed to and from the second processing block;

a forward bypath so provided as to extend from the first processing block to the third processing block and one end extending toward the neighborhood of the cassette section and the other end extending toward the neighborhood of the interface section; and a forward direct feeding mechanism movable along the forward bypath and so provided as to prevent an interference with the third main arm conveying mechanism, said forward direct feeding mechanism receiving the resist coated film formed by the coating unit from the first main arm conveying mechanism and directly feeding the substrate from the first processing block to the interface section.

2. A substrate processing apparatus for processing substrates one by one in accordance with a photolithography, comprising:

a cassette section for loading/unloading a plurality of cassettes;

a first sub-arm conveying mechanism provided in the cassette section to insert and take out the substrate into and from the cassette;

a first processing block provided adjacent to the cassette section and having a plurality of coating units for coating a resist solution onto the substrate;

an interface section provided adjacent to a second processing block for exposing, with light, a resist coated film formed on the substrate by the coating unit;

a third processing block provided between the interface section and the first processing block, and having a plurality of developing units for developing the resist coated film exposed with light by the second processing block;

a first main arm block conveying mechanism provided in the first processing block to allow the substrate to be passed to and from the first sub-arm conveying mechanism and to allow the substrate to be inserted into and taken out from the coating unit;

a third main arm conveying mechanism provided in the third processing block to allow the substrate to be passed to and from the first main arm conveying mechanism and to allow the substrate to be inserted into and taken out from the developing unit;

a second sub-arm conveying mechanism provided in the interface section to allow the substrate to be passed to an from the third main arm conveying mechanism and to allow the substrate to be also passed to and from the second processing block;

a backward bypath so provided as to extend from the first processing block to the third processing block and having one end extending toward the neighborhood of the cassette section and the other end extending toward the neighborhood of the interface section; and a backward direct feeding mechanism movable along the background bypath and so provided as to prevent an interference with the first main arm conveying mechanism, said background direct feeding mechanism receiving the substrate developed by the developing unit from the third main arm conveying mechanism and directly feeding the substrate from the third processing block to the cassette.

3. A substrate processing apparatus for processing substrates one by one in accordance with a photolithography, comprising:

a cassette section for loading/unloading a plurality of cassettes;

a first sub-arm conveying mechanism provided in the cassette section to insert and take out the cassette into and from the cassette;

a first processing block provided adjacent to the cassette section and having a plurality of coating units for coating a resist solution onto the substrate;

an interface section provided adjacent to a second processing block for exposing, with light, a resist coated film formed on the substrate by the coating unit;

a third processing block provided between the interface section and the first processing block, and having a plurality of developing units for developing the resist coated film exposed with light by the second processing block;

a first main arm conveying mechanism provided in the first processing block to allow the substrate to be passed to and from the first sub-arm conveying mechanism and to allow the substrate to be inserted into and taken out from the coating unit;

a third main arm conveying mechanism provided in the third processing block to allow the substrate to be passed to the first main arm conveying mechanism and to allow the substrate to be inserted into and taken out from the developing unit;

a second sub-arm conveying mechanism provided in the interface section to allow the substrate to be passed to and from the third main arm conveying mechanism and to allow the substrate to be also passed to and from the second processing block;

a forward bypath so provided as to extend from the first processing block to the third processing block and having one end extending toward the neighborhood of the cassette section and the other end extending toward the neighborhood of the interface section;

a forward direct feeding mechanism movable along the forward bypath and so provided as to prevent an interference with the third main arm conveying mechanism, said forward direct feeding mechanism receiving the substrate coated with the resist by the coating unit from the first main arm conveying mechanism and directly feeding the substrate from the first processing block to the interface section;

a backward bypath so provided as to extend from the first processing block to the third processing block and having one end extending toward the neighborhood of the cassette section and the other end extending toward the neighborhood of the interface section; and a backward direct feeding mechanism movable along the backward bypath and so provided as to prevent an interference with the first main arm feeding mechanism, said backward direct feeding mechanism receiving the substrate developed by the developing unit from the third main arm conveying mechanism and directly feeding the substrate from the third processing block to the cassette section.

4. An apparatus according to any of claim 1 or 3, further comprising:

a first heating section provided in the first processing block to heat-bake the resist film coated onto the substrate; and a first sub-conveying mechanism provided in the first processing block to pass the substrate which is heat-baked by the first heating section to the forward direct feeding mechanism.

5. An apparatus according to claim 2 or 3, further comprising:

a third heating section provided in the third processing block to heat-bake the resist film coated substrate exposed with light and a third sub-conveying mechanism provided in the third processing block to pass the substrate which is heat-baked by the third heating section to the backward direct feeding mechanism.

6. An apparatus according to claim 1 or 3, further comprising control means for selecting any one of the forward direct feeding mechanisms or third main arm conveying mechanism to allow the substrate to be conveyed from the first processing block to the interface section in accordance with the selected one.

7. An apparatus according to claim 2 or 3, further comprising control means for selecting any one of the backward direct feeding mechanism or first main arm conveying mechanism to allow the substrate to be conveyed from the third processing block to the cassette section in accordance with the selected one.

8. An apparatus according to claim 1 or 3, wherein the forward bypath is provided at upper areas of the first block and third block.

9. An apparatus according to claim 2 or 3, wherein the backward bypath is provided at upper areas of the first block and third block.

10. An apparatus according to any of claim 1 or 3, wherein the forward bypath is provided at lower areas of the first block and third block.

11. An apparatus according to claim 2 or 3, wherein the backward bypath is provided at lower areas of the first block and third block.

12. An apparatus according to claim 3, wherein the backward bypath is arranged just above the forward bypath.

13. An apparatus according to claim 2 or 3, wherein the backward direct feeding mechanism has at least one of a heating section for heat-treating the substrate and a cooling section.

14. An apparatus according to any of claims 1, 2 and 3, wherein the first processing block has a three-stage stacked resist coating unit and the third processing block has a three-stage stacked developing unit.

* * * * *